US008581684B2

(12) United States Patent
Noiré et al.

(10) Patent No.: US 8,581,684 B2
(45) Date of Patent: Nov. 12, 2013

(54) MULTIPLE-LEVEL INDUCTANCE

(75) Inventors: Aline Noiré, Antonedurocher (FR);
Benjamin Therond, Toulouse (FR)

(73) Assignee: STMicroelectronics S.A., Montrouge (FR)

( * ) Notice: Subject to any disclaimer, the term of this patent is extended or adjusted under 35 U.S.C. 154(b) by 569 days.

(21) Appl. No.: 12/020,687

(22) Filed: Jan. 28, 2008

(65) Prior Publication Data

US 2008/0180204 A1  Jul. 31, 2008

(30) Foreign Application Priority Data

Jan. 30, 2007 (FR) ...................................... 07 52957

(51) Int. Cl.
*H01F 5/00* (2006.01)

(52) U.S. Cl.
USPC ......................................................... 336/200

(58) Field of Classification Search
USPC ..................... 336/65, 83, 200, 206–208, 232; 257/531
See application file for complete search history.

(56) References Cited

U.S. PATENT DOCUMENTS

| 4,959,631 | A | * | 9/1990 | Hasegawa et al. | 336/83 |
| 4,964,145 | A | * | 10/1990 | Maldonado | 378/35 |
| 5,477,204 | A | * | 12/1995 | Li | 336/200 |
| 5,481,131 | A | * | 1/1996 | Staudinger et al. | 257/531 |
| 6,097,273 | A | * | 8/2000 | Frye et al. | 336/200 |
| 6,380,821 | B1 | * | 4/2002 | Imbornone et al. | 333/25 |
| 6,396,362 | B1 | * | 5/2002 | Mourant et al. | 333/25 |
| 6,559,751 | B2 | * | 5/2003 | Liu et al. | 336/223 |
| 6,894,598 | B2 | * | 5/2005 | Heima | 336/200 |
| 6,903,459 | B2 | * | 6/2005 | Nakatani | 257/758 |
| 6,959,482 | B2 | * | 11/2005 | Liang et al. | 29/602.1 |
| 7,042,325 | B2 | * | 5/2006 | Giandalia et al. | 336/200 |
| 7,327,131 | B2 | * | 2/2008 | Ezzeddine | 323/355 |
| 2002/0130721 | A1 | | 9/2002 | Tanemura | |
| 2002/0157849 | A1 | | 10/2002 | Sakata | |
| 2003/0030533 | A1 | | 2/2003 | Waffenschmidt | |
| 2003/0071706 | A1 | | 4/2003 | Christensen | |
| 2004/0140878 | A1 | | 7/2004 | Heima | |
| 2005/0099241 | A1 | | 5/2005 | Ezzeddine | |

FOREIGN PATENT DOCUMENTS

EP   1 363 296 A1   11/2003

OTHER PUBLICATIONS

French Search Report from corresponding French Application No. FR 07/52957, filed Jan. 30, 2007.
Atta, R.M.H, "Multi-Layer Double Coil Micro-Fabricated Transformer" Sensors and Actuators A, Elsevier Sequoia S.A., Lausanne, CH, vol. 112, No. 1, Apr. 15, 2004, pp. 61-65.
Skrastins et al., "Synthesis and Pharm", Khimiko-Farmatsevticheskii Zhurnal, Moscow, Ru, vol. 23, No. 11, 1989, pp. 1323-1326.

* cited by examiner

*Primary Examiner* — Tuyen Nguyen
(74) *Attorney, Agent, or Firm* — Wolf, Greenfield & Sacks, P.C.

(57) ABSTRACT

An inductive element formed of planar windings in different conductive levels, the windings being formed in a number of levels smaller by one unit than the number of windings, two of the windings being interdigited in a same level.

20 Claims, 2 Drawing Sheets

MULTIPLE-LEVEL INDUCTANCE

BACKGROUND OF THE INVENTION

1. Field of the Invention

The present invention generally relates to the forming of inductive elements for electronic circuits. The present invention more specifically applies to the forming of an inductance in several superposed conductive levels.

2. Discussion of the Related Art

In the field of integrated circuits, where to form passive components using similar technologies, the bulk of an inductive element is generally desired to be reduced by superposing different conductive windings formed in successive levels. Such a superposition enables, among others, taking advantage of the mutual inductance effect between windings to increase the value of the inductance for the same surface bulk.

A problem which is posed is to decrease the number of vias required to electrically connect the different windings of the different levels without for all this to require an additional level only to perform these connections.

Another difficulty is to preserve the spiral superposition to keep the mutual inductance effect.

SUMMARY OF THE INVENTION

At least one embodiment of the present invention aims at overcoming all or part of the disadvantages of conventional multiple-level inductances. At least one embodiment of the present invention more specifically aims at the forming of a multiple-level inductance in at least three conductive levels.

An object is a solution reducing the number of vias needed to form the inductance for a given number of conductive levels.

Another object is to preserve the superposition of the windings formed in the different levels.

Another object is a solution compatible with an even or odd number of windings.

Another object is a solution compatible with technologies for manufacturing integrated circuit as well as passive circuits.

To achieve all or part of these objects, as well as others, at least one embodiment of the present invention provides an inductive element formed of planar windings in different conductive levels, in which the windings are formed in a number of levels smaller by one unit than the number of windings, two of the windings being interdigited in a same level.

According to an embodiment, the number of conductive levels used corresponds to the number of available metallizations in the manufacturing technology used.

According to an embodiment, the terminals of access to the inductive element are outside of two windings formed in two different levels.

According to an embodiment, the windings are connected to one another by means of a number of vias equal to the number of conductive levels.

According to an embodiment, the windings have a general rectangular, circular, or octagonal shape.

According to an embodiment, the windings have the same track width.

According to an embodiment, the windings have track widths and/or spacings between the turns which are different from one level to the other.

According to an embodiment, the windings are formed in metallization levels of a passive circuit integration technology.

According to an embodiment, the windings are formed in metallization levels of an integrated circuit.

The present invention also provides a passive filter.

The present invention also provides a circuit of protection against electrostatic discharges.

The present invention also provides a supply circuit.

The present invention also provides a radiofrequency transceiver device.

The foregoing and other objects, features, and advantages of the present invention will be discussed in detail in the following non-limiting description of specific embodiments in connection with the accompanying drawings.

DETAILED DESCRIPTION

Figure 1:
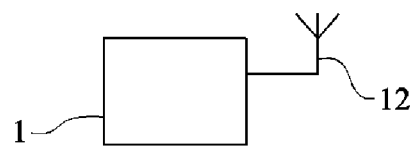
FIG. 1 very schematically shows a system to which the present invention applies as an example.

The same elements have been designated with the same reference numerals in the different drawings.

FIG. 1 very schematically shows an electronic device of the type to which the present invention applies as an example. It is a radio-frequency transmit and/or receive device 1 provided with an antenna 12. Antenna 12 is connected to circuit 1 which contains various elements of transmission/reception and of interpretation of the transmitted and received signals. Device 1 may contain one or several multiple-level inductive elements, for example, to form baluns of the power combiners/dividers, inductive filtering elements, antenna 12, etc.

Figure 2:
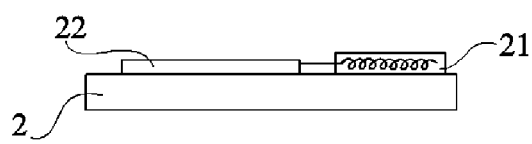
FIG. 2 is a simplified cross-section view of an electronic circuit of the type to which the present invention applies as an example.

FIG. 2 is a simplified cross-section view of an electronic circuit 2 comprising an inductive element 21 symbolically shown as a coil, but formed as a multiple-level inductance. Element 21 is connected to other elements 22 of circuit 2, be they other passive components or active areas made in a semiconductor substrate.

One or several inductances may be used as inductive elements in passive filters, in power supply circuits, for example, switched-mode power supplies, in circuits of protection against electrostatic discharges (ESD), etc.

The present invention will be described hereafter in relation with the forming of an inductive winding in several successive metal levels of a stack. It however more generally applies whatever the type of used conductive level (metal, properly-doped semiconductor, etc.), be the levels successive or not in the stack forming the electronic circuit and whatever the number of formed inductive elements.

Figure 3A:
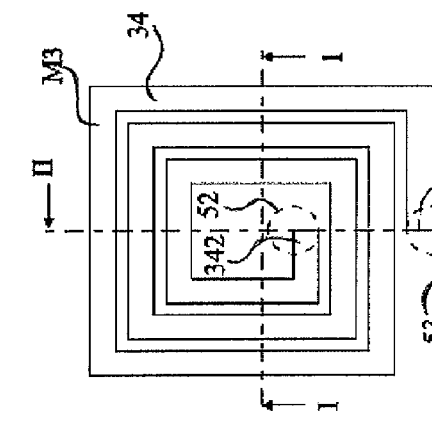
FIGS. 3A, 3B, and 3C are top views of an embodiment of a multiple-level inductance.
Figure 3B:
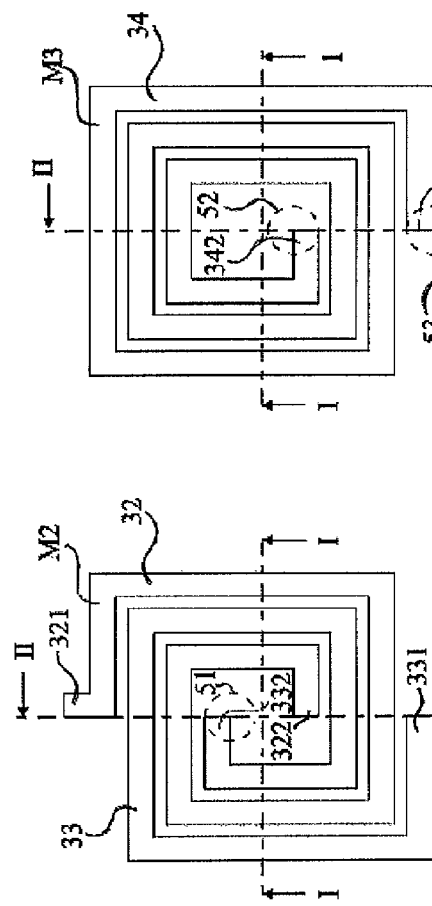
Figure 3C:
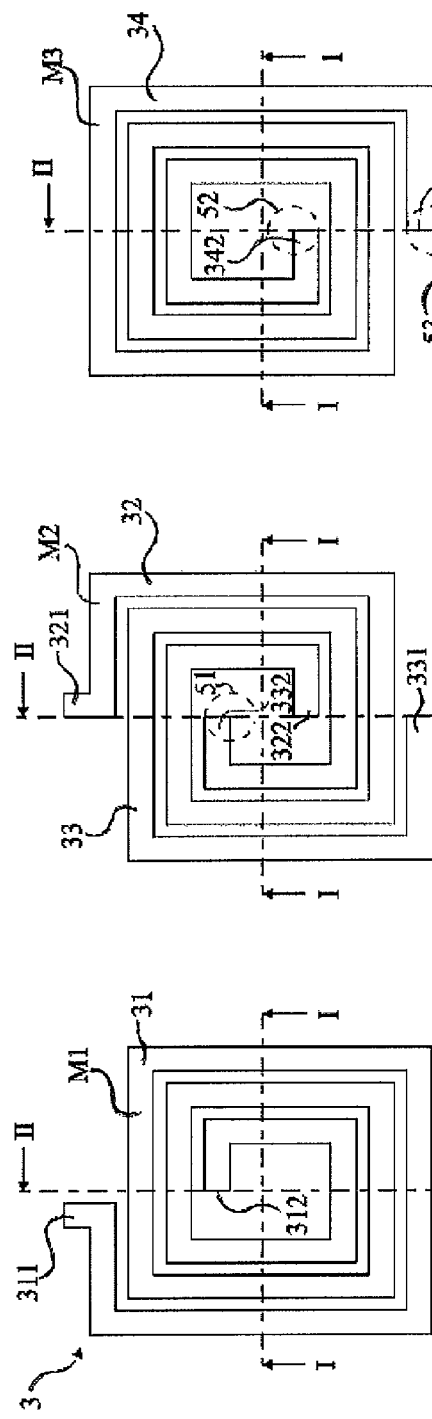

FIGS. 3A, 3B, and 3C are top views of an inductive element. Such drawings show successive metal levels deposited on a substrate, for example, insulating (not visible in FIGS. 3A to 3C).

Figure 4A:
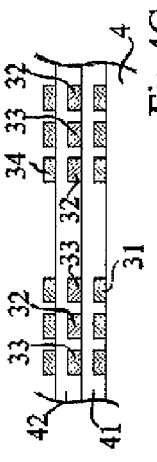
FIGS. 4A, 4B, and 4C are cross-section views respectively taken along lines I-I of FIGS. 3A to 3C.
Figure 4B:
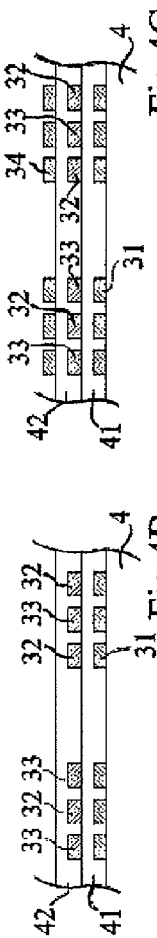
Figure 4C:
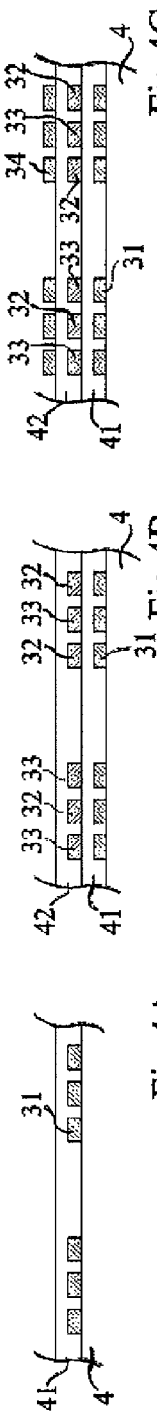

FIGS. 4A, 4B, and 4C are cross-section views taken along lines I-I of FIGS. 3A to 3C.

Figure 5A:
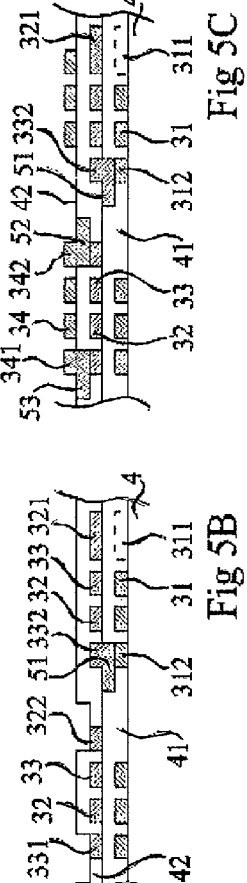
FIGS. 5A, 5B, and 5C are cross-section views respectively taken along lines II-II of FIGS. 3A to 3C.
Figure 5B:
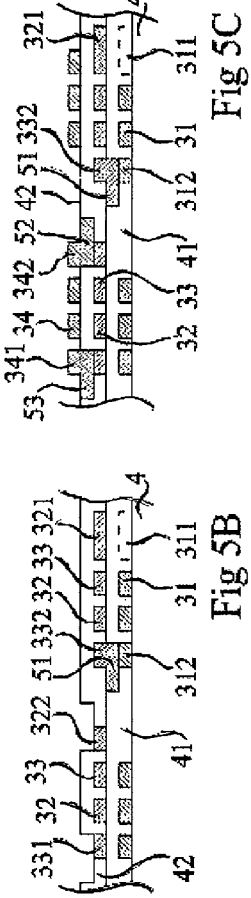
Figure 5C:
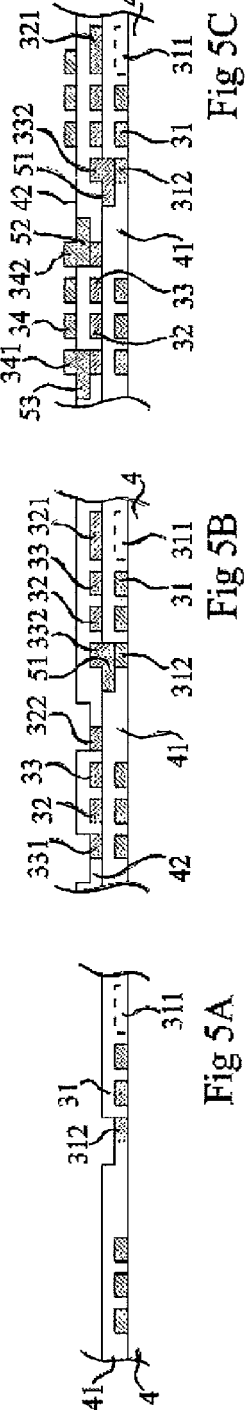

FIGS. 5A, 5B, and 5C are respective cross-section views taken along lines II-II of FIGS. 3A to 3C.

In this example, an inductive element 3 is formed in three metal levels M1 (FIG. 3A), M2 (FIG. 3B), and M3 (FIG. 3C), as four planar windings 31 (FIG. 3A), 32 and 33 (FIG. 3B), and 34 (FIG. 3C). Two windings 32 and 33 are formed in the same level (in this example, M2) by being interdigited with each other. Each of the two windings 32 and 33 has approximately half less turns than the other windings.

Assuming that levels M1, M2, and M3 form successive levels in the forming of the circuit, it is started from a substrate 4 (FIGS. 4A and 4B), for example, an insulating substrate. Winding 31 is formed in first metal level M1, its external end 311 defining one of the two terminals of the inductive element while its internal end 312 is intended to be connected by a via 51 (FIGS. 3B and 5B) to winding 33 of level M2. In this level M2, a first winding 32 starts from an external end 321 defining the other terminal of the inductive element, to end at an internal end 322 which is intended to be connected by a via 52 to subsequently-deposited level M3 (FIGS. 3C, 4C, and 5C). Second winding 33 of level M2 starts from an external end 331 (for example, diametrically opposite to end 321) to end at its internal end 332 at the level of via 51. End 331 is intended to be connected by a third via 53 to an external end 341 of winding 34 of level M3.

In the illustrated example, windings 31 and 34 wind counterclockwise from their respective external ends 311 and 341. Windings 32 and 33 of level M2 wind clockwise from their respective external ends 321 and 331. As a result, the current can always flow in the same direction, whatever the level. Starting from end 311 in level M1, the current flows from the outside to the inside down to end 312, passes at level M2 through via 51, then from the inside (end 332) to the outside of winding 33 down to its end 331, runs through via 53 in winding 34 (level M3) where it flows from the outside (end 341) to the inside down to end 342, to return to level M2 through via 52 and terminate its flowing from the inside (end 322) to the outside, down to end 321. The opposite is of course possible.

It can be seen that three vias are sufficient to form the inductive element in three conductive levels. An advantage of decreasing the number of vias is, for integrated circuit embodiments, to decrease the resistances due to these vias and, for passive circuit embodiments (thicker tracks), to decrease the surface bulk.

In FIGS. 4A to 4C and 5A to 5C, insulating levels 41 and 42 interposed between levels M1 and M2 have been illustrated. In practice, an insulating level may also be placed on level M3 before completing the circuit. In FIGS. 5A and 5B, openings in levels 41 and 42 have been illustrated at the locations of the vias (respectively 51, then 52 and 53) formed in the subsequent level.

An advantage of the provided structure is that the vias are located at ends of the windings such that they can, if need be, have a diameter greater than the width of the tracks forming these windings. This is what has been illustrated in the foregoing representation.

Another advantage is that the structure bulk is decreased with respect to conventional structures.

Another advantage is that the order of the conductive levels is of no importance, since the vias of connection of the different ends do not cross tracks of the windings. It is thus possible to adapt the stacked levels according to the levels in which the contact recovery tracks for inputs/outputs 311 and 321 of the inductive element are located. Vias can then further be spared.

Another advantage is to allow track widths and/or spacings between the winding turns which are different from one level to another according to the constraints and possibilities of the used technology. For example, the dimensions are adapted according to the features of the used metallization levels, which may be different from one level to the other. If the used levels allow it, identical widths and spacings from one level to the other may however be provided, which improves the coupling.

Figure 6:
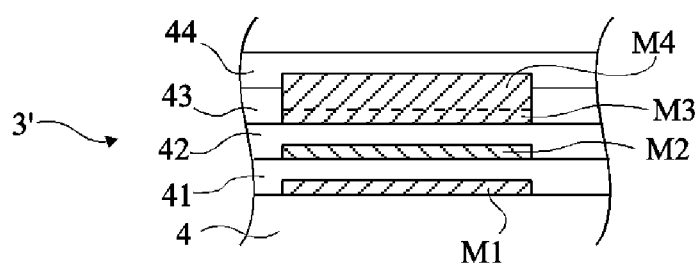
FIG. 6 is a top view illustrating a variation of a multiple-level inductance.

FIG. 6 very schematically shows in cross-section view a variation of an inductive element 3'. Four metallization levels M1 to M4 stacked on a semiconductor or insulating substrate 4 and separated from one another by insulating layers 41 to 43 are used to form the inductance, a last insulating level 44 protecting the top of the circuit. Levels M3 and M4 are here combined to form one of windings 31 or 34, or the two windings 32 and 33. This example illustrates the case of the use of several levels for one or several of the windings, for example, for resistance matters.

Figure 7:
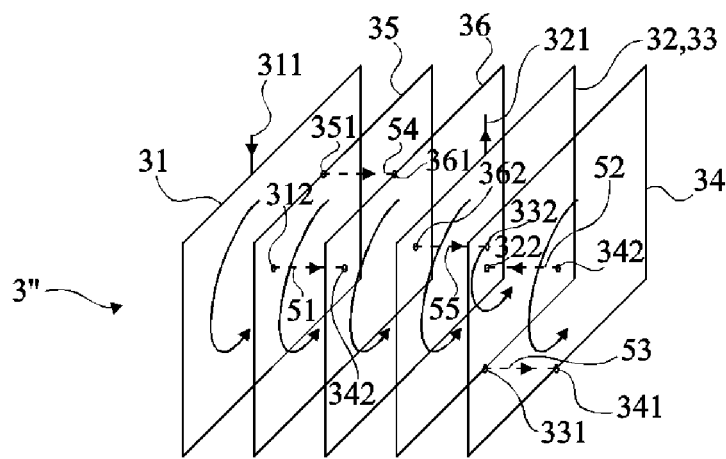
FIG. 7 is a partial cross-section view illustrating another variation of a multiple-level inductance.

FIG. 7 is a simplified view illustrating another variation of an inductive element 3". Although it has been shown with a horizontal axis, the structure may have a vertical axis. For example, five levels are used to form the inductive element by means of six windings, among which two windings 32 and 33 in a same level. Looking from the left in the arrangement of the drawing, first winding 31 winds clockwise from the outside to the inside. A first via 51 connects its internal end 312 to internal end 352 of a (fifth) winding 35 formed in the adjacent level. This winding also winds clockwise towards its external end 351. End 351 is connected by a (fourth) via 54 to an external end 361 of a (sixth) winding 36 formed in the level adjacent to that of winding 35. Winding 36 winds clockwise from the outside to the inside. Its internal end 362 is connected by a (fifth) via 55 to internal end 332 of third winding 33. It winds clockwise from the inside to the outside. Its external end 331 is connected by via 53 to external end 341 of fourth winding 34 which winds clockwise from the outside to the inside. Internal end 342 of winding 34 returns to the previous level through via 52 to connect internal end 322 of second winding 32, which winds clockwise from the inside to the outside and has its external end 321 defining the second terminal of the inductive element.

The structure is thus compatible with an increase in the number of conductive levels. It enables forming an inductive element over N stages with N conductive levels, by forming N+1 windings with a number N of vias and by obtaining the ends of the inductive elements outside of the structure. Here again, the order of the levels is of no importance, provided that the additional vias with respect to the three vias of the minimum structure can be formed. One may, for example, shift (angularly or radially) one or both ends of a winding so that they are not contacted by a via connecting ends of windings formed in surrounding levels. The provided structure is particularly advantageous in the case where the number of available conductive levels is odd.

For a horizontal embodiment (horizontal axis) of the inductive element, it is sufficient to consider that each turn of a winding is formed in two separate conductive levels by means of two vias between these two levels while vias 51 to 55 are in fact conductive sections in a same level. The number of required conductive levels then corresponds to twice the number of turns of windings 31 and 34.

Of course, the present invention is likely to have various alterations, modifications, and improvements which will readily occur to those skilled in the art. In particular, although the present invention has been described in relation with an approximately square shape of the windings, it is compatible with any other shape (for example, circular, oval, triangular, polygonal, etc.), knowing that a square or rectangular structure is generally preferred since it optimizes the winding superposition in the different levels, which increases the mutual inductance, and thus the inductive value obtained for a given bulk.

Further, the present invention is compatible with current techniques for manufacturing electronic circuits, be it an embodiment using printed circuit manufacturing or thin layer integrated circuit manufacturing technologies. As a specific embodiment, the respective thicknesses of the planar windings range between 0.1 and 10 µm.

Moreover, the vias may have any shape (square, round, etc.), for example selected according to the shape of the vias available in the used technology.

Finally, the present invention is compatible with the integration of an axial magnetic core at the center of the structure.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An inductive element comprising planar windings disposed in at least three different conductive levels, wherein the windings are formed in a number of levels smaller by one unit than the number of windings, two of the windings being interdigited in a same level, and wherein the planar windings form a single electrical pathway.

2. The inductive element of claim 1, wherein a number of conductive levels used corresponds to a number of available metallizations in the manufacturing technology used.

3. The inductive element of claim 1, further comprising terminals of access to the inductive element disposed outside of two windings and formed in two different levels.

4. The inductive element of claim 1, wherein the windings are connected to one another by a number of vias equal to the number of conductive levels.

5. The inductive element of claim 1, wherein the windings have a general rectangular, circular, or octagonal shape.

6. The inductive element of claim 1, wherein the windings have a same track width and a same spacing between turns.

7. The inductive element of claim 1, wherein the windings have track widths and/or spacings between the turns which are different from one level to the other.

8. The inductive element of claim 1, wherein the windings are formed in metallization levels of a passive circuit integration technology.

9. The inductive element of claim 1, wherein the windings are formed in metallization levels of an integrated circuit.

10. A passive filter comprising at least one inductive element of claim 1.

11. A circuit of protection against electrostatic discharges comprising at least one inductive element of claim 1.

12. A supply circuit comprising at least one inductive element of claim 1.

13. A radio-frequency transceiver device comprising at least one inductive element of claim 1.

14. The inductive element of claim 1, wherein windings are connected to one another by a number of vias, the vias having a diameter that is greater than a diameter of the windings.

15. An inductive element comprising:
conductive levels, the conductive levels having a bottom end conductive level and a top end conductive level; and
planar windings disposed in each of the conductive levels, the planar windings having a first terminal end, wherein the first terminal end is disposed in a conductive level other than one of the bottom or top end conductive levels and the first terminal end is the sole terminal end disposed in the conductive level, and at least two of the planar windings are interdigited.

16. The inductive element of claim 15, wherein the first terminal end is disposed in a conductive level that is adjacent to one of the bottom or top end conductive levels.

17. The inductive element of claim 16, wherein the first terminal end is disposed in a conductive level that is adjacent to the top end conductive level.

18. The inductive element of claim 15, further comprising a second terminal end wherein the second terminal end is disposed within one of the bottom or top end conductive levels.

19. The inductive element of claim 18, wherein the second terminal end is disposed within the bottom end conductive level.

20. An inductive element comprising:
conductive levels, the conductive levels having a bottom end level and a top end level; and
planar windings disposed in the conductive levels, wherein the planar windings have two terminal ends and at least two of the planar windings are interdigited.

* * * * *